United States Patent
Cartier et al.

(10) Patent No.: US 7,919,379 B2
(45) Date of Patent: Apr. 5, 2011

(54) DIELECTRIC SPACER REMOVAL

(75) Inventors: Eduard A. Cartier, New York, NY (US); Rashmi Jha, Wappingers Falls, NY (US); Sivananda Kanakasabapathy, Niskayuna, NY (US); Xi Li, Somers, NY (US); Renee T. Mo, Briarcliff Manor, NY (US); Vijay Narayanan, New York, NY (US); Vamsi Paruchuri, Albany, NY (US); Mark T. Robson, Danbury, CT (US); Kathryn T. Schonenberg, Wappingers Falls, NY (US); Michelle L. Steen, Danbury, CT (US); Richard Wise, Newburgh, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 583 days.

(21) Appl. No.: 11/852,906

(22) Filed: Sep. 10, 2007

(65) Prior Publication Data

US 2009/0065817 A1 Mar. 12, 2009

(51) Int. Cl.
*H01L 21/00* (2006.01)
*H01L 21/336* (2006.01)
(52) U.S. Cl. ........ 438/302; 438/304; 438/305; 438/306; 438/592; 257/316; 257/320; 257/387; 257/E21.202; 257/E21.205; 257/E21.444

(58) Field of Classification Search .................. 438/304, 438/305, 306, 592; 257/316, 320, 387, E21.202, 257/E21.205, E21.444
See application file for complete search history.

(56) References Cited

U.S. PATENT DOCUMENTS

| | | | | |
|---|---|---|---|---|
| 6,372,589 | B1 * | 4/2002 | Yu .................................. | 438/304 |
| 7,271,049 | B2 * | 9/2007 | Gluschenkov et al. ........ | 438/230 |
| 7,494,885 | B1 * | 2/2009 | Pelella et al. .................. | 438/302 |

* cited by examiner

*Primary Examiner* — Dao H Nguyen
(74) *Attorney, Agent, or Firm* — Scully, Scott, Murphy & Presser, P.C.; Vazken Alexanian

(57) ABSTRACT

The present invention relates to semiconductor devices, and more particularly to a process and structure for removing a dielectric spacer selective to a surface of a semiconductor substrate with substantially no removal of the semiconductor substrate. The method of the present invention can be integrated into a conventional CMOS processing scheme or into a conventional BiCMOS processing scheme. The method includes forming a field effect transistor on a semiconductor substrate, the FET comprising a dielectric spacer and the gate structure, the dielectric spacer located adjacent a sidewall of the gate structure and over a source/drain region in the semiconductor substrate; depositing a first nitride layer over the FET; and removing the nitride layer and the dielectric spacer selective to the semiconductor substrate with substantially no removal of the semiconductor substrate.

14 Claims, 4 Drawing Sheets ically known. The patterned gate stack 15 is formed on a thin
DIELECTRIC SPACER REMOVAL

FIELD OF THE INVENTION

The present invention relates to semiconductor devices, and more particularly to a process and structure for removing dielectric spacers selective to a surface of a semiconductor substrate with substantially no removal of the semiconductor substrate.

BACKGROUND OF THE INVENTION

Complementary metal-oxide semiconductors (CMOS) are a major class of integrated circuits (ICs). CMOS chips include microprocessors, microcontrollers, static random access memory (RAM), and other digital logic circuits. An advantage of CMOS technology is that it only uses significant power when its transistors are switching between on and off states. Consequently, CMOS devices use significantly less power and produce less heat than other forms of logic devices. CMOS technology also allows a high density of logic functions on a chip. "Metal-oxide-semiconductor" is a reference to the fabrication of early (and in some cases, the very latest) field-effect transistors, having a metal gate electrode placed on top of an oxide insulator, which in turn is on top of a semiconductor substrate. Although metal gates have made a comeback with the advent of high-k dielectric materials in the CMOS transistor, current gate electrodes are typically made from polysilicon.

The metal-oxide-semiconductor field-effect transistor (MOSFET) is based on modulation of charge concentration caused by a MOS capacitance. It includes two terminals (source and drain) each connected to separate highly doped regions. These regions can be either p or n-type, with the source and drain regions of the same device having the same polarity. The source and drain (S/D) regions are separated by a doped region of opposite polarity, known as the body. This region is not highly doped. The active region constitutes a MOS capacitance with a third electrode, the gate, which is located above the body and insulated from all of the other regions by an oxide. In current technologies, the gate electrode is further insulated from the S/D regions by one or more dielectric spacers.

In the present and advanced CMOS technologies, there is a need to remove one or more of the dielectric spacers. Applications of the desired structure and method include, but are not limited to, stress engineering for enhanced mobility and integration of advanced gate structures (e.g., finFET, Metal Gate/High-k, etc.). The dielectric spacer can be removed by either a wet chemical etch or by a reactive ion etch (RIE), as known to those skilled in the art. However, there are technology-limiting drawbacks with each methodology. Specifically, lateral etch/undercut which is inherent to wet etch processes at the gate level cannot be tolerated at the pitch used in advanced technologies. Furthermore, the wet etch rate is very low relative to RIE, leading to process times that are longer than desired.

RIE process times are relatively shorter than wet etch processes, but there are several problems with RIE-based methods. First, it is difficult to etch the dielectric spacer selective to p-doped and more importantly, n-doped Si in the extension and S/D regions of the semiconductor device. This lack of specificity can lead to severe negative device performance. Specifically, a method with poor selectivity to doped Si can produce the undesired structure shown schematically in FIGS. 1(*a*)-1(*c*).

As shown, FIG. 1(*a*) depicts a cross-sectional view of a portion of a semiconductor device manufactured in accordance with conventional prior art processing techniques. In FIG. 1(*a*), a semiconductor device 10 includes a substrate 12 and a patterned gate stack 15 including gate silicide contact 18 formed thereon. Each patterned gate stack 15 comprises a gate material such as polycrystalline silicon, as is conventionally known. The patterned gate stack 15 is formed on a thin gate dielectric layer (not shown) previously formed on top of the substrate 12. Prior to the implantation of the silicon in the extension and S/D regions of the device 12, a thin nitride spacer 20 is first formed on sidewalls of patterned gate stack 15. The silicon in the S/D regions of the device are then reacted with metal to form low resistivity cobalt, titanium, or nickel silicide contacts 18. FIG. 1(*b*) represents the structure during spacer removal by RIE. Here the RIE process has progressed to a point in which the nitride spacer 20 has been partially removed. FIG. 1(*c*) represents the semiconductor device 10 at the conclusion of the RIE process, after the spacer 20 has been removed. As shown, the Si extension regions 22 are recessed by plasma damage during the RIE process. This leads to a loss of electrical contact between the gate and the S/D. Furthermore, it is difficult to remove densified silicon nitride selective to metal silicide. Damage to the silicide used to contact the gate and S/D can lead to higher contact resistance or even electrical shorts. Additionally, it is difficult to remove densified silicon nitride selective to oxide. This is especially problematic because oxide is often used as a composite spacer material and oxide is used for fill in shallow trench isolation.

Hence, a method for removing dielectric spacers in a semiconductor device with a high selectivity to doped Si, metal silicide and oxide is needed to produce the desired structure having substantially no recesses in the semiconductor substrate over the extension or S/D regions.

SUMMARY OF THE INVENTION

The present invention relates to semiconductor devices, and more particularly to a process and structure for removing dielectric spacers selective to a surface of a semiconductor substrate with substantially no removal of the semiconductor substrate.

Specifically, and in broad terms, the semiconductor device of the present invention comprises:
a field effect transistor (FET) on a semiconductor substrate, wherein the FET comprises a gate structure having no dielectric spacers located adjacent thereto, and wherein the semiconductor substrate adjacent the gate structure has substantially no recesses in the semiconductor substrate after dielectric spacer removal; and
a planarizing layer over the gate structure.

In a related aspect, the device further comprises:
a middle-of-the line (MOL) dielectric layer over the planarizing layer enclosing the FET; and
a barrier conductor layer over the MOL dielectric layer for metalization of the FET.

In a related aspect, the gate structure comprises a gate conductor and a gate dielectric located beneath the gate conductor.

In a related aspect, the FET further comprises source/drain regions.

In a related aspect, the gate conductor comprises polysilicon.

Another aspect of the present invention relates to a method for removing a dielectric spacer in a semiconductor device, the method comprising:

forming a field effect transistor (FET) on a semiconductor substrate, the FET comprising a dielectric spacer and a gate structure, the dielectric spacer located adjacent a sidewall of the gate structure and over a S/D region in the semiconductor substrate;
depositing a sacrificial layer over the FET; and
removing the sacrificial layer and the dielectric spacer selective to the semiconductor substrate with substantially no removal of the semiconductor substrate.

In a related aspect, the removing includes etching the sacrificial layer and the dielectric spacer using a RIE process.

In a related aspect, the removing comprises etching the sacrificial layer and the dielectric spacer using a wet chemical etch process following the RIE process.

In a related aspect, the removing includes etching the nitride layer and the dielectric spacer using a two step downstream dry chemical etch process, by which the first step is a non-selective downstream breakthrough etch process that etches the toughened doped dielectric spacer, followed by a more gentle, highly selective downstream dry chemical etch process.

In a related aspect, the downstream breakthrough etch process comprises a tetrafluoromethane breakthrough etch process.

In a related aspect, the tetrafluoromethane breakthrough etch process is approximately 40-50 seconds and the downstream chemical etch process is approximately 60-70 seconds.

In a related aspect, the removing includes etching the sacrificial layer and the dielectric spacer using a wet chemical etch process.

In a related aspect, the method further comprises:
depositing a second sacrificial layer over the FET following removal of the sacrificial layer and the dielectric spacer;
etching the second sacrificial layer and any remaining dielectric spacer material using a RIE process; and
etching the second sacrificial layer and any remaining dielectric spacer material using a wet chemical etch process.

In a related aspect, the first nitride layer has a thickness of about 100 to about 500 Å.

In a related aspect, the CMOS gate structure comprises a gate dielectric located beneath a gate conductor.

In a related aspect, the method further comprises:
depositing a planarizing layer over the gate structure following removal of the dielectric spacer;
enclosing the FET with a MOL dielectric layer over the planarizing layer; and
forming a barrier conductor layer over the MOL dielectric layer for metalization of the FET.

In another aspect according to the present invention, a method is provided for removing a dielectric spacer in a CMOS gate structure which comprises forming a field effect transistor (FET) on a semiconductor substrate, wherein the FET comprises the dielectric spacer and a CMOS gate structure including a gate dielectric located beneath a gate conductor. The dielectric spacer is located adjacent a sidewall of the gate conductor and over a S/D region in the semiconductor substrate. A sacrificial layer is deposited over the CMOS gate structure. The sacrificial layer and the dielectric spacer are removed selective to a top surface of the semiconductor substrate with substantially no removal of the substrate over the S/D region.

In a related aspect, the removing includes etching the sacrificial layer and the dielectric spacer using a reactive ion etch (RIE) process.

In a related aspect, the removing comprises etching the sacrificial layer and the dielectric spacer using a wet chemical etch process following the RIE process.

In a related aspect, the removing includes etching the sacrificial layer and the dielectric spacer using a dry chemical etch process.

In a related aspect, the method further comprises depositing a second sacrificial layer over the FET following removal of the sacrificial layer and the dielectric spacer. The second sacrificial layer and any remaining dielectric spacer material are then etched using a RIE process. The second sacrificial layer and any remaining dielectric spacer material are further etched using a wet chemical etch process.

The present invention relates to semiconductor devices, and more particularly to a process and structure for removing dielectric spacers selective to a surface of a semiconductor substrate with substantially no removal of the semiconductor substrate. Depositing at least one sacrificial layer over the gate structure to remove the dielectric spacers without causing a substantial recess in the semiconductor substrate greatly reduces the likelihood of an electrical contact failure and facilitates different applications of stress engineering for enhanced mobility and integration of advanced gate structures.

DETAILED DESCRIPTION OF THE INVENTION

Figure 1A:
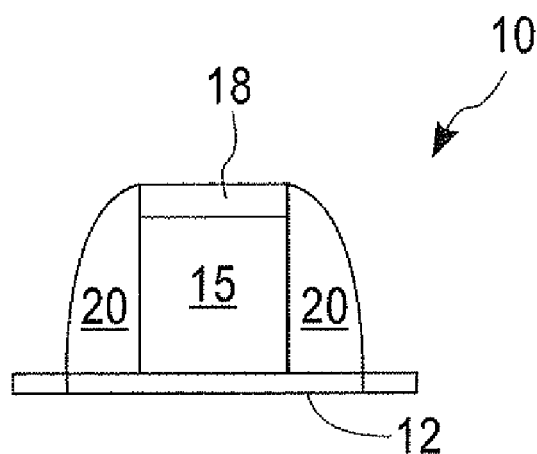
FIGS. 1A-1C are pictorial representations (through cross sectional views) illustrating the basic processing steps employed in the prior art for removing a dielectric spacer.
Figure 1B:
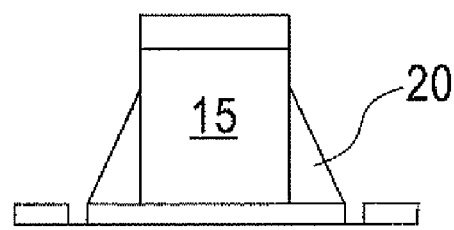
Figure 1C:
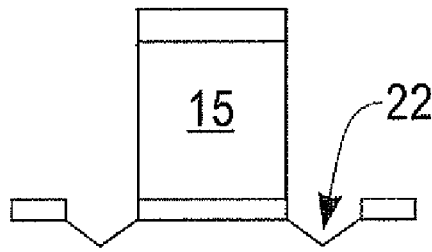

The present invention, which provides a semiconductor device comprising a semiconductor substrate having substantially no recesses in the semiconductor substrate after dielectric spacer removal, as well as a method of fabricating the same will now be described in greater detail by referring to the drawings that accompany the present application. It is noted that the drawings of the present application are provided for illustrative purposes and are thus not drawn to scale. Moreover, like and corresponding elements shown in the drawings are referred to by like reference numerals.

Reference is made to FIGS. 2-6, which are cross sectional views of a semiconductor structure during various stages of an embodiment of the present invention. Although the drawings show the presence of a single gate (i.e., a CMOS transistor structure with either pFET and/or nFET transistors), the present invention is not limited to that number of gates. Instead, the present integration process works for any number of gates. Hence, a plurality of gates may be present across a single semiconductor structure. Furthermore, it is noted that the semiconductor structure that can be formed in the present invention includes, for example, MOS capacitors, FETs, floating gate FET nonvolatile memory, dynamic random access memory (DRAM) and any other type of semiconductor device that includes a stack of a dielectric and a conductive material.

Figure 2:
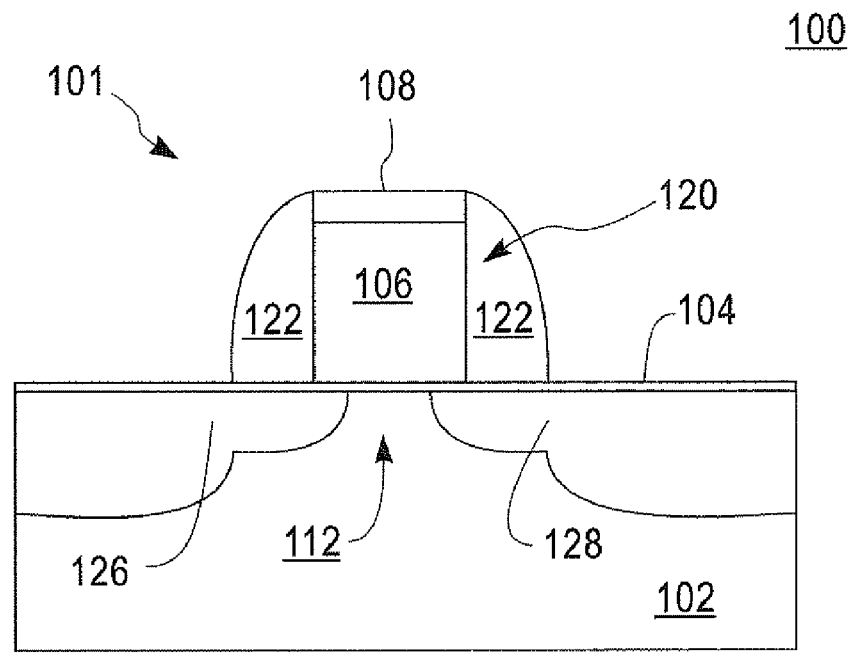
FIG. 2 is a pictorial representation (through a cross sectional view) illustrating the basic structure and related method in the present invention for removing a dielectric spacer.

FIG. 2 shows an initial device 100 that is employed in a method for removing a dielectric spacer in a gate structure. Specifically, the initial device 100 shown in FIG. 2 comprises semiconductor substrate 102 and a gate dielectric 104 located on top of the semiconductor substrate 102. This is the case if the dielectric is deposited as for a high-k material, but not if the dielectric is grown as is typical for $SiO_2$ or $SiO_xN_y$. In the present invention, conductive gate 106 and gate silicide contact 108 are located atop selected portions of the gate dielectric 104. Each conductive gate 106 and its corresponding gate silicide contact 108 are referred to herein as gate structure 120. A dielectric spacer 122 is located on sidewalls of the gate structure 120.

The semiconductor substrate 102 comprises any semiconducting material including, but not limited to: Si, Ge, SiGe, SiC, SiGeC, Ga, GaAs, InAs, InP and all other III/V compound semiconductors. Semiconductor substrate 102 may also comprise a layered semiconductor such as Si/SiGe, a silicon-on-insulator (SOI) or a SiGe-on-insulator (SGOI). Preferably, the semiconductor substrate 102 is a Si-containing semiconductor substrate. The semiconductor substrate 102 may be doped, undoped or contain doped and undoped regions therein.

In FIG. 2, reference numeral 112 refers to a doped (n- or p-) region in substrate 102. These doped regions are known as "wells". Although a single well is shown for the sake of clarity, the present invention is not limited to that number of wells. Instead, the present integration process works for any number of wells. Hence, a plurality of wells may be present across a single semiconductor structure. Furthermore, the doped regions may have the same or different conductivities.

A process for forming the initial structure shown in FIG. 2 will now be described. The process comprises forming a field effect transistor (FET) 101 on the semiconductor substrate 102, the FET 101 comprising the dielectric spacer 122 and the gate structure 120. As shown, the dielectric spacer 122 is located adjacent a sidewall of the gate structure 122 and over the S/D regions 126, 128 in the semiconductor substrate 102.

Although not shown, in a first step, isolation regions are formed into the semiconductor substrate 102. Isolation regions may be trench isolation regions or field oxide isolation regions. Trench isolation regions are formed utilizing a conventional trench isolation process well known to those skilled in the art. For example, lithography, etching and filling of the trench with a trench dielectric may be used in forming the trench isolation regions. Optionally, a liner may be formed in the trench prior to trench fill. A densification step and a planarization process may be performed after the trench fill. The field oxide regions may be formed utilizing a so-called local oxidation of silicon process.

Next, the well region 112 is formed by ion implantation and annealing. The type of dopant used in forming each well is dependent on the final polarity of the FET. N-type dopants, such as an element from Group VA of the Periodic Table of Elements (e.g., As and P), are employed in forming the N-wells, while p-type dopants, such as an element from Group IIIA of the Periodic Table of Elements (e.g., B, In and Ga), are used in forming the P-well.

Notwithstanding the type of dopant used, each well region typically has a dopant concentration from about 1E17 to about 1E19 atoms/cm$^3$, with a dopant concentration from about 1E17 to about 1E18 atoms/cm$^3$ being more typical.

The implantation conditions used in forming each well region are conventional and are well known to those skilled in the art. For example, the implant conditions for forming a N-well region can include a n-type dopant dosage from about 1E12 to about 8E15 atoms/cm$^2$ and an energy from about 30 to about 1000 keV. The P-well region can be formed utilizing a p-type dopant dosage from about 1E12 to about 8E13 atoms/cm$^2$ and an energy from about 30 to about 600 keV. If a reach-through (n-type) implant is available in the technology, one would replace this implant for the standard N-well implants. Typically, this reach-through implant includes a n-type dopant such as Sb, wherein dopant dosage is from 5E13 to 5E14 and an energy from 100 to 300 keV.

The ion implantations can be performed using a substantially vertical ion implantation process, or alternatively, an angled ion implantation process.

An annealing process is used to activate the dopants within each well region. A single annealing step can be used after the well region is formed, or alternatively, an anneal process can follow the implantation of each individual well region. The annealing temperature used in the present invention is typically from about 900° C. or greater, with an annealing temperature from about 1000° C. or greater being more typical. The annealing times may vary depending on the type of anneal process used. For example, annealing times of about 5 minutes or less are typically used for a rapid thermal anneal (RTA) process, a laser annealing, or a spike anneal, while annealing times of about 30 minutes or greater are typically used for furnace annealing.

It should be noted that the activation of the well regions can be delayed until another thermal cycle within the process of the present invention is performed. For example, the well regions can be activated during source/drain diffusion activation. Delaying the activation of the well regions until a latter thermal process is advantageous since it reduces the number of thermal cycles, and hence cost, within the overall process.

After forming the isolation regions and the well regions within the semiconductor substrate 102, gate dielectric 104 is formed on the entire surface of the structure including the semiconductor substrate 102 and atop the isolation regions if it is a deposited dielectric. The gate dielectric 104 can be formed by a thermal growing process such as, for example, oxidation, nitridation or oxynitridation. Alternatively, the gate dielectric 104 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 104 may also be formed utilizing any combination of the above processes.

The gate dielectric 104 is comprised of an insulating material including, but not limited to: an oxide, nitride, oxynitride and/or silicate. In one embodiment, it is preferred that the gate dielectric 104 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 104 may vary, but typically, the gate dielectric 14 has a thickness from about 0.5 to about 10 nm, with a thickness from about 0.5 to about 3 nm being more typical.

After forming the gate dielectric 104, a blanket gate electrode layer (i.e., polySi, SiGe, polySiGe, metal silicides, metals, etc.) is formed on the gate dielectric 104 utilizing a known deposition process such as, for example, physical vapor deposition, CVD or evaporation. Furthermore, advanced technologies (e.g., 32-nm node and beyond) may use a heterogeneous gate stack comprising a thin metal in contact with the gate dielectric, in this case high-k, and a polysilicon cap. The gate electrode layer may be doped or undoped. If doped, an in-situ doping deposition process may be employed in forming the same. Alternatively, a doped polySi layer can be formed by deposition, ion implantation and annealing. The doping of the polySi layer will shift the work function of the silicide gate formed. Illustrative examples of dopant ions include As, P, B, Sb, Bi, In, Al, Ga, Tl or mixtures thereof. The thickness, i.e., height, of the gate electrode layer deposited at this point of the present invention may vary depending on the deposition process employed. Typically, the gate electrode layer has a vertical thickness from about 20 to about 180 nm, with a thickness from about 40 to about 150 nm being more typical.

Next, a gate silicide contact layer is formed over the gate electrode layer and then patterned by lithography and etching so as to provide patterned gate structure 120. In one embodiment, the gate electrode layer and gate silicide contact layer have a total height of approximately 100 nm. The patterned gate structure 120 may have the same dimension, i.e., length, or they can have variable dimensions to improve device performance. As shown in FIG. 2, each patterned gate structure 120 includes a conductive gate 106 and gate silicide contact 108 formed from the gate electrode and the gate silicide contact layers, respectively. The lithography step includes applying a photoresist to the upper surface of the gate silicide contact layer, exposing the photoresist to a desired pattern of radiation and developing the exposed photoresist utilizing a conventional resist developer. The pattern in the photoresist is then transferred to the gate silicide contact layer and the gate conductor layer utilizing one or more dry etching steps. In some embodiments, the patterned photoresist may be removed after the pattern has been transferred into the gate silicide contact layer. In other embodiments, the patterned photoresist is removed after etching has been completed.

Suitable dry etching processes that can be used in the present invention in forming the patterned gate structure 120 include, but are not limited to: reactive ion etching, ion beam etching, plasma etching or laser ablation. The dry etching process employed is typically selective to the underlying gate dielectric 104 and therefore does not typically remove the gate dielectric. However, in some embodiments, this etching step may be used to remove portions of the gate dielectric 104 that are not protected by the gate structure 120.

Next, at least one dielectric spacer 122 is formed on exposed sidewalls of each patterned gate structure 120. The dielectric spacer 122 is comprised of an insulator such as an oxide, nitride, oxynitride and/or any combination thereof, and is formed by deposition and etching. Although not shown, one embodiment of the invention includes multiple spacers on each side sidewall having different widths. In another embodiment, the multiple spacer scheme is replaced by a wide single spacer.

When multiple spacers are used, each spacer can be composed of different insulators. For example, one spacer may be comprised of $SiO_2$ while another spacer may be comprised of $Si_3N_4$.

The width of the spacers must be sufficiently wide enough such that the source/drain silicide contacts (to be subsequently formed) do not encroach underneath the edges of the gate stack. Typically, the source/drain sib cides do not encroach underneath the edges of the gate stack when the spacers have a width, as measured at the bottom, from about 20 to about 80 nm.

After spacer formation, S/D regions 126, 128 are formed into the substrate. The S/D regions 126, 128 are formed utilizing ion implantation and an annealing step. The annealing step serves to activate the dopants that were implanted by the previous implant step. The conditions for the ion implantation and annealing are well known to those skilled in the art. The term "source/drain regions" includes deep S/D diffusion regions, optional halo implants and S/D extension regions.

The S/D regions 126, 128, and optionally at least a portion of gate structure 120 can then be silicided using a conventional S/D silicidation process and metal gate silicidation processes that are well known to those skilled in the art.

Figure 3:
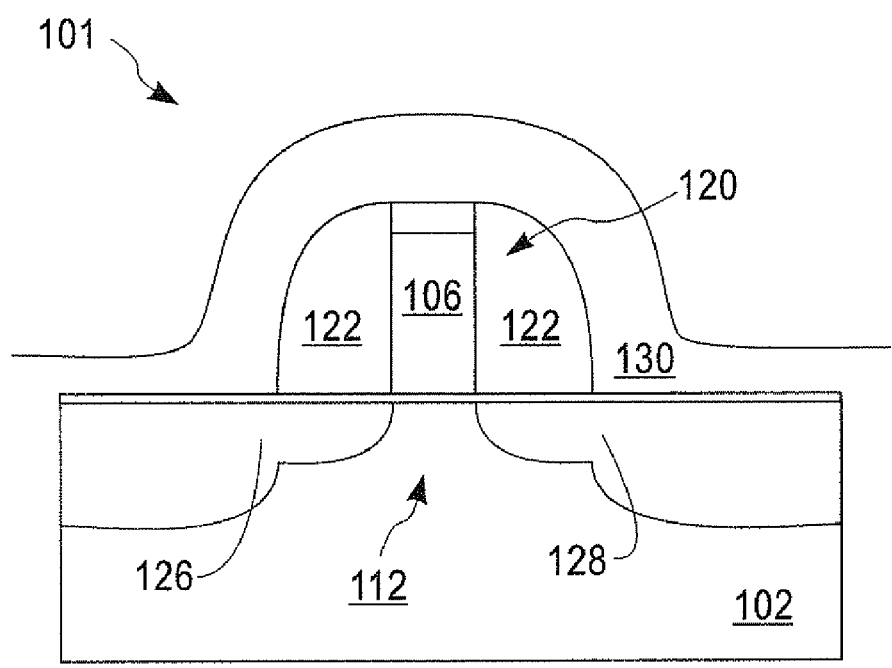
FIG. 3 is a pictorial representation (through a cross sectional view) illustrating the basic structure and related method in the present invention for removing a dielectric spacer.

With reference to FIGS. 3-6, a novel structure and method for overcoming limitations of the prior art will now be described. As shown in FIG. 3, the sacrificial layer 130 can be formed by a deposition process such as, for example, chemical vapor deposition (CVD), plasma-assisted CVD), atomic layer deposition (ALD), evaporation, reactive sputtering, chemical solution deposition and other like deposition processes. The sacrificial layer 130 may also be formed utilizing any combination of the above processes. The sacrificial layer 130, having a thickness from approximately 100 to about 500 Å, serves as a planarizing film to minimize the etch dependence on the spacer profile. This allows for more uniform and orthogonal removal of the sacrificial layer to the substrate.

Figure 4:
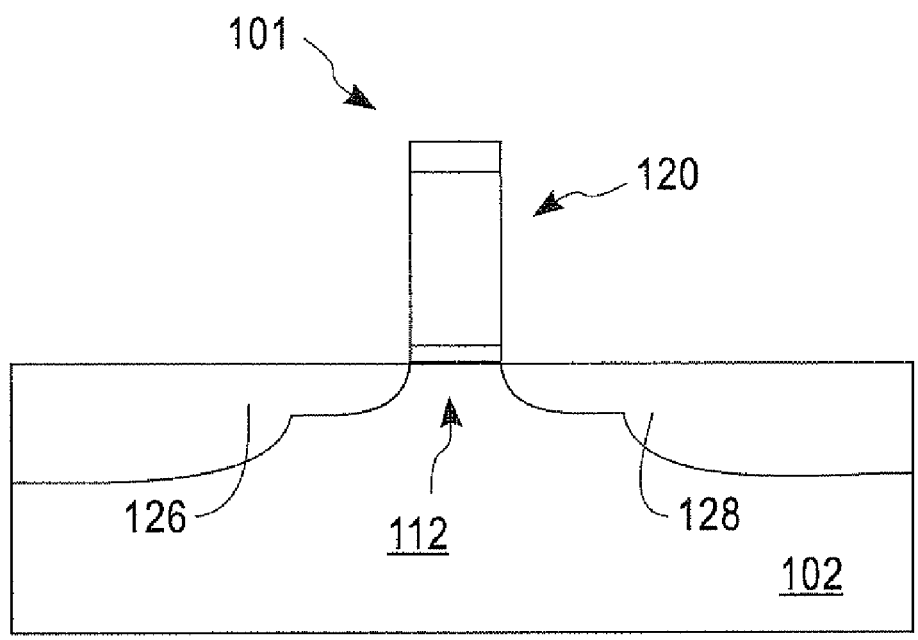
FIG. 4 is a pictorial representation (through a cross sectional view) illustrating the basic structure and related method in the present invention for removing a dielectric spacer.

Next, as shown in FIG. 4, the sacrificial layer 130 and the dielectric spacer 122 is removed selective to the semiconductor substrate 102 with substantially no removal of the semiconductor substrate. FIG. 4 shows the FET 101 on the semiconductor substrate 102, wherein the FET 101 comprises the gate structure 120 having no dielectric spacers located adjacent thereto, and wherein the semiconductor substrate 102 adjacent the gate structure 120 has substantially no recesses in the semiconductor substrate 102 after dielectric spacer removal. Removing the spacer without causing a substantial recess in the semiconductor substrate greatly reduces the likelihood of an electrical contact failure and facilitates different applications of stress engineering for enhanced mobility and integration of advanced gate structures (e.g., finFET, metal gate/high-k, etc.). It should be appreciated that a number of different methods for removing the dielectric spacer is possible within the scope of the invention, as described below.

In one embodiment of the invention, the sacrificial layer 130 and the dielectric spacer is removed using a RIE process. The RIE process removes the sacrificial layer 130 and dielectric spacer 122 over the semiconductor substrate 102. The planarizing sacrificial layer 130 allows orthogonal spacer removal selective to the semiconductor S/D and to silicide on the gate and in the field. In some cases, a further etch is performed on the sacrificial layer and the dielectric spacer using a wet chemical etch process after the RIE process. As is known in the art, the wet chemical etch process uses a chemical etchant such as acids, bases and solvents to chemically remove wafer surface material. This wet chemical etch process can be used to remove any spacer material that may have remained following the RIE process.

In another embodiment of the invention, the removal method includes etching the sacrificial layer 130 and the dielectric spacer 122 using a dry chemical etch process. In this embodiment, the dry chemical etch process includes performing a downstream breakthrough etch process followed by a downstream dry chemical etch process. In this embodiment, the downstream breakthrough etch process comprises a tetrafluoromethane ($CF_4$) etch process. In the first step, the $CF_4$ etch process is performed on the sacrificial layer 130 and the dielectric spacer 122 for approximately 40-50 seconds. The $CF_4$ etch process uniformly removes sacrificial layer 130 and a majority of the dielectric spacer 122. In the second step, the downstream dry chemical etch process is performed for approximately 60-70 seconds to remove any material remaining from the dielectric spacer 122. As with the other embodiments of the invention described herein, the dry chemical etch process removes the sacrificial layer and the dielectric spacer selective to the semiconductor substrate with substantially no removal of the semiconductor substrate.

Figure 5:
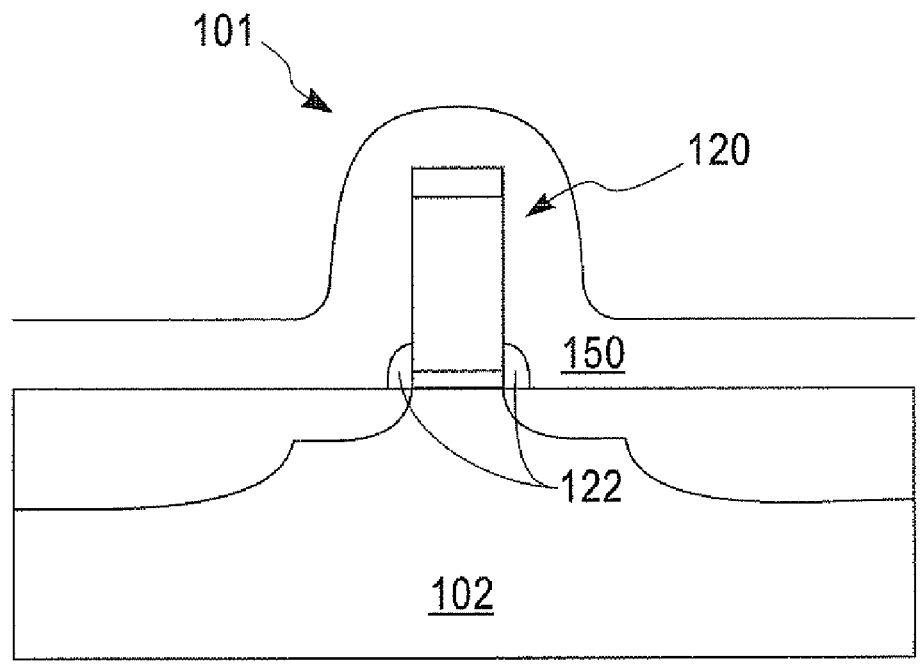
FIG. 5 is a pictorial representation (through a cross sectional view) illustrating the basic structure in the present invention after removal of the dielectric spacer.

In another embodiment of the invention, additional sacrificial layers may be deposited over the gate structure 120. In this embodiment, as shown in FIG. 5, a second sacrificial layer 150 is deposited over the gate structure 120 following the removal of the first sacrificial layer 130 and the dielectric spacers 122. As shown in FIG. 5, a portion of the dielectric spacers 122 may remain on semiconductor substrate 102 and/or gate structure 120 following removal of the sacrificial layer 130. Accordingly, the second sacrificial layer 150 is deposited and etched to remove the second sacrificial layer 150 and any remaining dielectric spacer material using a RIE process. In some cases, an additional wet chemical etch process can be subsequently performed to further etch the second sacrificial layer 150 and any remaining dielectric spacer material. The removal of the second sacrificial layer 150 and any remaining spacer material selective to the semiconductor substrate 102 results in the structure shown in FIG. 4, wherein the semiconductor substrate 102 has substantially no recesses after dielectric spacer removal.

In yet another embodiment of the invention, if longer processing times can be tolerated, the sacrificial layer 130 and dielectric spacers 122 are removed using a single wet chemical etch process. A wet etchant that is highly selective to oxide, doped silicon and silicide can be used to achieve the desired structure shown in FIG. 4.

Figure 6:
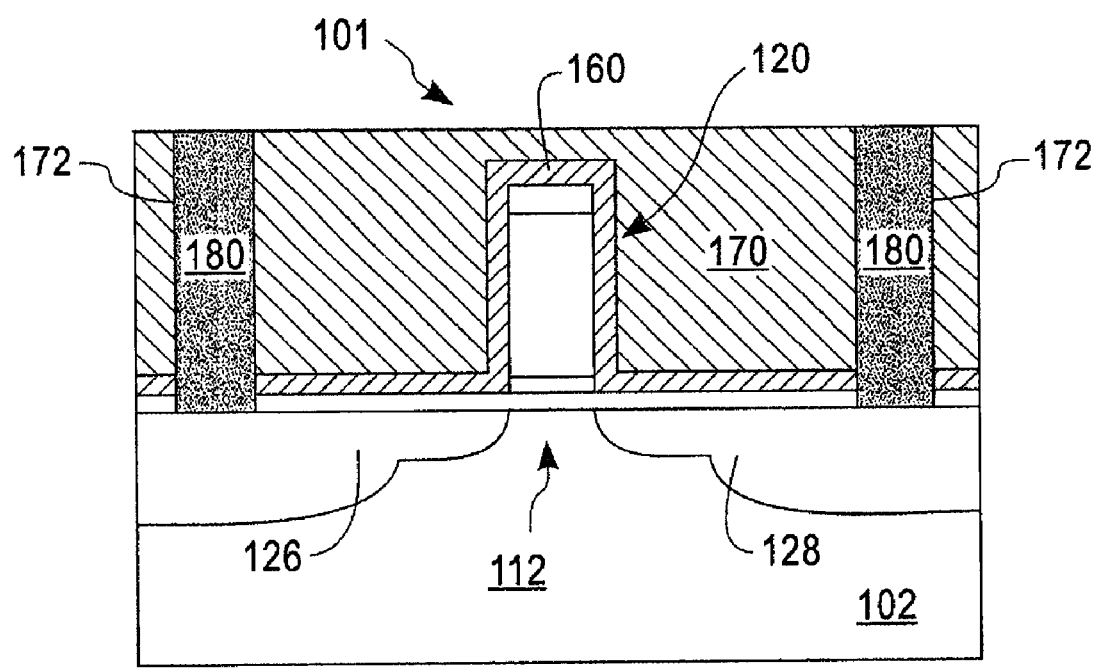
FIG. 6 is a pictorial representation (through a cross sectional view) illustrating the basic structure in the present invention after removal of the dielectric spacer.

Next, as shown in FIG. 6, a planarizing layer 160, such as nitride or oxide, may be deposited over the gate structure 120 following the removal of dielectric spacer 122 from the semiconductor device. In one embodiment, the planarizing layer 160 comprises a stressed nitride layer. Deposition of a stressed nitride layer is a method for enhancing transistor performance, wherein the atomic lattice of the nitride is stressed to improve the electrical properties of the material itself, or of underlying or overlying material that is strained by the force applied by stressed nitride. Lattice strain can increase the carrier mobility of semiconductors, such as silicon, thereby increasing the saturation current of the doped silicon transistors to thereby improve their performance. The type of stress desirable in the deposited material depends upon the nature of the material being stressed. For example, in CMOS device fabrication, negative-channel (NMOS) doped regions may be covered with a tensile stressed material having (positive sign convention) tensile stress; whereas positive channel MOS (PMOS) doped regions may be covered with a compressive stressed material having (negative sign convention) stress values.

Then, as also shown in FIG. 6, a MOL dielectric layer 170 is deposited over the gate structure 120 by a CVD method. MOL dielectric layer 170 may include oxides, silicates, siloxanes, silesquioxenes, etc., and can be formed by a deposition process such as, for example, chemical vapor deposition (CVD), plasma-assisted CVD, atomic layer deposition (ALD), evaporation, reactive sputtering, chemical solution deposition and other like deposition processes. Successively, the surface of the MOL dielectric layer 170 is planarized by polishing, for example, by a chemical mechanical polishing (CMP) method. Further, connection holes 172 are apertured in the silicon oxide layer 170 above the S/D extension regions in the substrate 102 using photolithography.

Then, a barrier conductor layer 180 made, for example, of titanium nitride is formed over the MOL dielectric layer 170 for metalization of the FET 101. Successively, the barrier conductor layer 180 on the silicon oxide layer 170, other than the connection holes 172, is removed, for example, by a CMP method to form plugs.

Although not shown for the sake of brevity, a conventional CMOS fabrication process can be subsequently performed to complete the CMOS device, as is well known in the art.

While the present invention has been particularly shown and described with respect to preferred embodiments thereof, it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

What we claim is:

1. A method for removing a dielectric spacer in a semiconductor device, the method comprising:
    forming a field effect transistor (FET) on a semiconductor substrate, the FET comprising a dielectric spacer and a gate structure, the dielectric spacer located adjacent a sidewall of the gate structure and over a source/drain (S/D) region in the semiconductor substrate, and wherein said dielectric spacer is selected from the group consisting of an oxide, a nitride, an oxynitride and any combination thereof;
    depositing a sacrificial layer over the gate structure; and
    removing the sacrificial layer and the dielectric spacer selective to the semiconductor substrate with substantially no removal of the semiconductor substrate, wherein said removing includes a dry chemical etch process.

2. The method of claim 1, wherein the dry chemical etch process includes a reactive ion etch (RIE) process.

3. The method of claim 2, further comprising a wet chemical etch process following the RIE process.

4. The method of claim 1, wherein the dry chemical etch process includes performing a downstream breakthrough etch process followed by a downstream dry chemical etch process.

5. The method of claim 4, wherein the downstream breakthrough etch process comprises a tetrafluoromethane breakthrough etch process.

6. The method of claim 1, further comprising:
    depositing a second sacrificial layer over the gate structure following removal of the sacrificial layer and the dielectric spacer;
    etching the second sacrificial layer and any remaining dielectric spacer material using a RIE process; and
    etching the second sacrificial layer and any remaining dielectric spacer material using a wet chemical etch process.

7. The method of claim 1, wherein the sacrificial layer has a thickness from about 100 to about 500 Å.

8. The method of claim 1, further comprising:
    depositing a planarizing layer over the gate structure following removal of the dielectric spacer;
    enclosing the FET with a middle-of-the line (MOL) dielectric layer over the planarizing layer; and
    forming a barrier conductor layer over the MOL dielectric layer for metalization of the FET.

9. The method of claim 8, wherein the gate structure comprises a polysilicon gate conductor.

10. A method for removing a dielectric spacer in a complementary metal oxide semiconductor (CMOS) device, the method comprising:
  forming a field effect transistor (FET) on a semiconductor substrate, the FET comprising a dielectric spacer, a gate structure including a gate dielectric located beneath a gate conductor, the dielectric spacer located adjacent a sidewall of the gate conductor and over a source/drain (S/D) region in the semiconductor substrate, and wherein said dielectric spacer is selected from the group consisting of an oxide, a nitride, an oxynitride and any combination thereof;
  depositing a sacrificial layer over the gate structure; and
  removing the sacrificial layer and the dielectric spacer selective to a top surface of the semiconductor substrate with substantially no removal of the semiconductor substrate over the S/D region, wherein said removing includes a dry chemical etch process.

11. The method of claim 10, wherein the dry chemical etching process includes a reactive ion etch (RIE) process.

12. The method of claim 11, further comprising a wet chemical etch process following the RIE process.

13. The method of claim 10, wherein the dry chemical etch process includes performing a downstream breakthrough etch process followed by a downstream dry chemical etch process.

14. The method of claim 10, further comprising:
  depositing a second sacrificial layer over the gate structure following removal of the sacrificial layer and the dielectric spacer;
  etching the second sacrificial layer and any remaining dielectric spacer material using a RIE process; and
  etching the second sacrificial layer and any remaining dielectric spacer material using a wet chemical etch process.

* * * * *